(12) United States Patent
Lin

(10) Patent No.: US 9,054,466 B2
(45) Date of Patent: Jun. 9, 2015

(54) INTEGRATED CIRCUIT ASSEMBLY FOR HIGH-FREQUENCY ON-BOARD PRINTED CIRCUIT BOARD TESTING, VALIDATION, AND VERIFICATION

(75) Inventor: David S. Lin, Taipei (TW)

(73) Assignee: UNIGEN TAIWAN CORPORATION, Taipei (TW)

(*) Notice: Subject to any disclaimer, the term of this patent is extended or adjusted under 35 U.S.C. 154(b) by 194 days.

(21) Appl. No.: 13/586,981

(22) Filed: Aug. 16, 2012

(65) Prior Publication Data

US 2014/0049896 A1    Feb. 20, 2014

(51) Int. Cl.
| | |
|---|---|
| *H05K 7/00* | (2006.01) |
| *H01R 12/71* | (2011.01) |
| *H01R 12/73* | (2011.01) |
| *H05K 1/14* | (2006.01) |
| *H05K 3/32* | (2006.01) |
| *H05K 3/34* | (2006.01) |

(52) U.S. Cl.
CPC ............. *H01R 12/712* (2013.01); *H01R 12/73* (2013.01); *H05K 1/141* (2013.01); *H05K 3/32* (2013.01); *H05K 3/3436* (2013.01); *H05K 2201/042* (2013.01); *H05K 2201/049* (2013.01); *H05K 2201/10159* (2013.01); *H05K 2201/10189* (2013.01); *H05K 2201/10962* (2013.01); *H05K 2203/176* (2013.01)

(58) Field of Classification Search
CPC ........ H01L 25/00; H01L 25/043; H01R 9/09; H01R 23/68; H05K 1/11; H05K 1/14; H05K 1/141; H05K 1/142; H05K 1/147; H05K 1/144; H05K 1/145; H05K 1/18; H05K 1/181; H05K 1/182
USPC ......... 361/760, 724, 725, 727–730, 736, 737, 361/748, 752, 761, 764, 772
See application file for complete search history.

(56) References Cited

U.S. PATENT DOCUMENTS

2006/0237225 A1* 10/2006 Kariya et al. ................. 174/260

* cited by examiner

*Primary Examiner* — Tremesha S Willis
(74) *Attorney, Agent, or Firm* — Ladas & Parry LLP

(57) ABSTRACT

An integrated circuit assembly includes a main board unit mounted fixedly on and connected electrically to an external circuit board, a daughter board unit disposed on and connected detachably to the main board unit, and an integrated circuit device mounted fixedly on and connected electrically to the daughter board unit. When the daughter board unit is connected to the main board unit, the integrated circuit device is connected electrically to the external circuit board via the main board unit and the daughter board unit.

8 Claims, 5 Drawing Sheets

INTEGRATED CIRCUIT ASSEMBLY FOR HIGH-FREQUENCY ON-BOARD PRINTED CIRCUIT BOARD TESTING, VALIDATION, AND VERIFICATION

BACKGROUND OF THE INVENTION

1. Field of the Invention

The invention relates to an integrated circuit device, and more particularly to an integrated circuit assembly.

2. Description of the Related Art

For a personal computer (PC) with several DRAM ICs soldered on a main board, if any one of the DRAM ICs soldered on the main board malfunctions, the whole main board must be detached from the PC to replace the malfunctioning DRAM IC. In this case, the PC cannot be used during maintenance, thereby resulting in inconvenience. In order to overcome this drawback, a memory module for a PC is used. The memory module includes a printed circuit board, and several memory-mounting sockets secured on the printed circuit board for mounting respectively several DRAM ICs. However, such memory-mounting socket, especially for a dual in-line package (DIP) memory, has a relatively large thickness. For example, a memory-mounting socket mounted on a DRR3 memory module of Model No. CK1G08D3 has a thickness of 18 mm. Therefore, such memory-mounting socket is not suitable for a computerized apparatus with a compact size.

SUMMARY OF THE INVENTION

Therefore, an object of the present invention is to provide an integrated circuit assembly that can overcome the aforesaid drawbacks of the prior art.

According to the present invention, there is provided an integrated circuit assembly adapted to be mounted on an external circuit board that is formed with a plurality of electrical contacts. The integrated circuit assembly of this invention comprises a main board unit, a daughter board unit, and an integrated circuit device.

The main board unit includes a main circuit board and a main connector unit. The main circuit board has opposite mounting and connecting side surfaces. The mounting side surface of the main circuit board is formed with a plurality of electrical contacts corresponding respectively and adapted to be connected respectively and electrically to the electrical contacts of the external circuit board. The main connector unit is disposed fixedly on the connecting side surface of the main circuit board, and has a plurality of first conductive terminals arranged so that each of the electrical contacts on the mounting side surface of the main circuit board is connected electrically to a corresponding one of the first conductive terminals.

The daughter board unit includes a daughter circuit board and a daughter connector unit. The daughter circuit board has opposite mounting and connecting side surfaces. The mounting side surface of the daughter circuit board is formed with a plurality of electrical contacts corresponding respectively to the electrical contacts on the mounting side surface of the main circuit board. The daughter connector unit is disposed fixedly on the connecting side surface of the daughter circuit board, and is coupled detachably to the main connector unit. The daughter connector unit has a plurality of second conductive terminals arranged so that each of the electrical contacts on the mounting side surface of the daughter circuit board is connected electrically to a corresponding one of the second conductive terminals and so that the second conductive terminals of the daughter connector unit contact electrically and respectively the first electrical terminals of the main connector unit when the daughter connector unit is coupled to the main connector unit.

The integrated circuit device is mounted fixedly on the mounting side surface of the daughter circuit board, and has a plurality of electrical contacts connected electrically and respectively to the electrical contacts on the mounting side surface of the daughter circuit board such that the integrated circuit device is connected electrically to the external circuit board via the daughter board unit and the main board unit.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
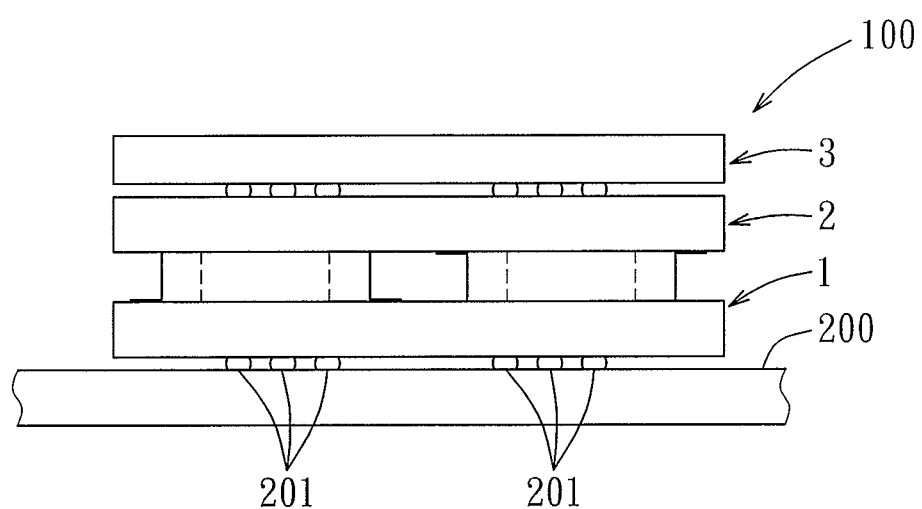
FIG. 1 is a schematic side view showing the first preferred embodiment of an integrated circuit assembly according to the present invention when mounted on an external circuit board.

Before the present invention is described in greater detail, it should be noted that like elements are denoted by the same reference numerals throughout the disclosure.

Figure 2:
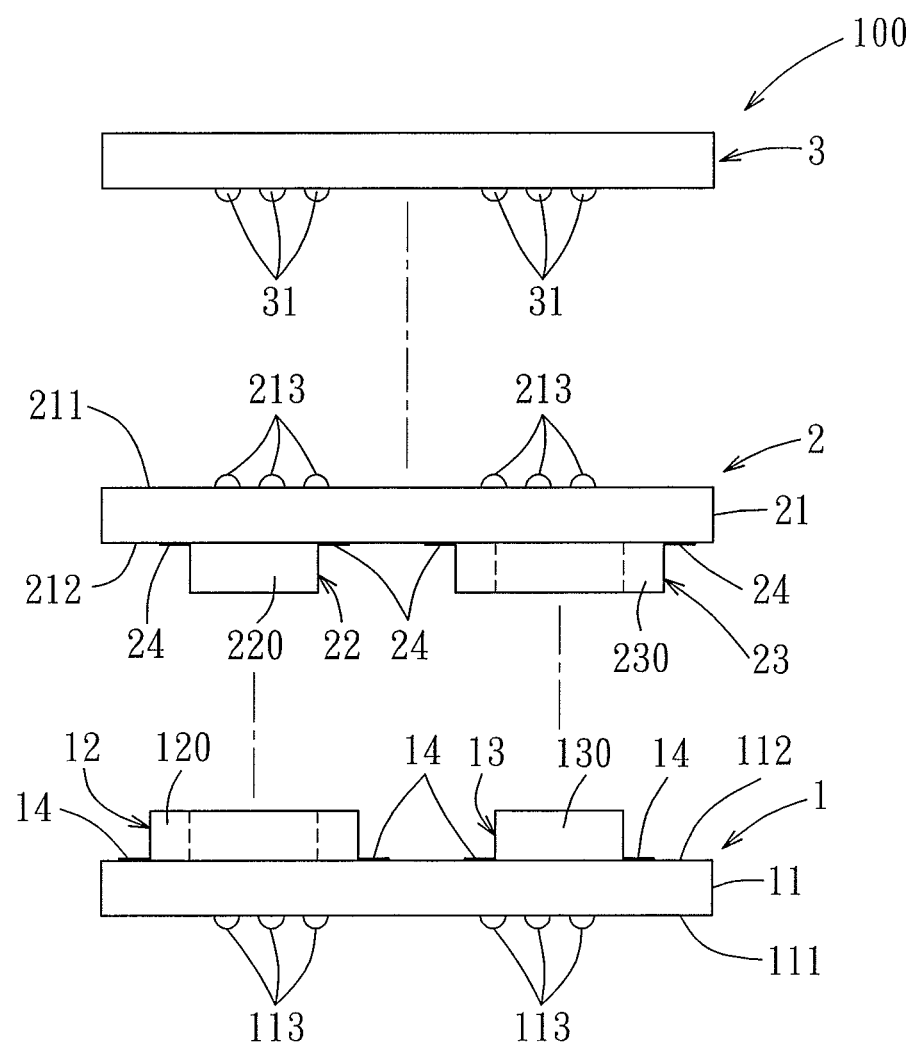
FIG. 2 is an exploded schematic side view showing the first preferred embodiment.

Referring to FIGS. 1 and 2, the first preferred embodiment of an integrated circuit assembly 100 according to the present invention is shown to include a main board unit 1, a daughter board unit 2, and an integrated circuit device 3. The integrated circuit assembly 100 is adapted to be mounted on an external circuit board 200. The external circuit board 200, such as a main board of an electronic apparatus, is formed with a plurality of electrical contacts 201 (see FIG. 1). In this embodiment, the electrical contacts 201 on the external circuit board 200 are arranged for mounting a DRAM IC, but are not limited thereto.

Figure 4:
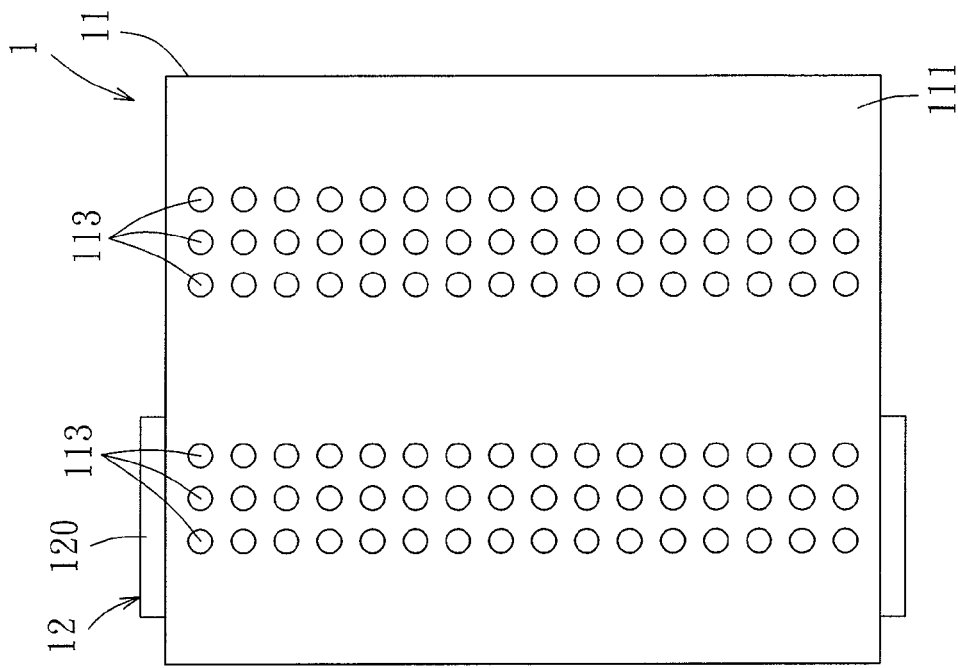
FIG. 4 is a schematic bottom view showing the main board unit of the first preferred embodiment.
Figure 3:
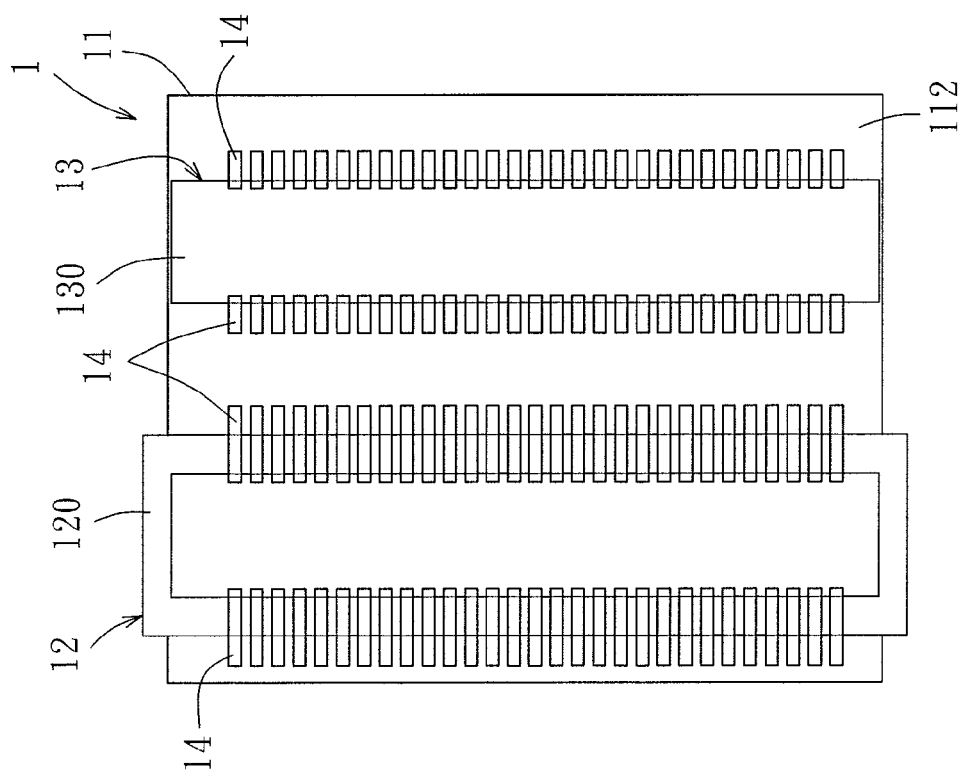
FIG. 3 is a schematic top view showing a main board unit of the first preferred embodiment.

Referring further to FIGS. 3 and 4, the main board unit 1 includes a main circuit board 11, and a main connector unit.

The main circuit board 11 has opposite mounting and connecting side surfaces 111, 112. The mounting side surface 111 of the main circuit board 11 is formed with a plurality of electrical contacts 113 in the form of solder balls that are arranged to correspond respectively to the electrical contacts 201 of the external circuit board 200 (see FIG. 4). The electrical contacts 113 on the mounting side surface 111 of the main circuit board 11 are adapted to be connected respectively and electrically to the electrical contacts 201 of the external circuit board 200 through surface-mount soldering, thereby surface-mounting the main circuit board 11 on the external circuit board 200 (see FIG. 1).

The main connector unit is disposed fixedly on the connecting side surface 112 of the main circuit board 11, and has a plurality of first conductive terminals 14 arranged so that each electrical contact 113 on the mounting side surface 111 of the main circuit board 11 is connected electrically to a corresponding first conductive terminal 14 through a printed circuit (not shown) formed on the main circuit board 11. In this embodiment, the main connector unit includes a first connector 12 and a second connector 13. The first connector 12 has a socket body 120 (see FIG. 2) that is mounted with half the first conductive terminals 14 thereon, as best shown in FIG. 3, wherein each first conductive terminal 14 has a first end attached to the connecting side surface 112 of the main circuit board 11 and disposed outwardly of the socket body 120, a second end opposite to the first end, disposed in the socket body 120 and attached to the connecting side surface 112 of the main circuit board 11, and an inverted U-shaped portion interconnecting the first and second ends and extending along the socket body 120. The second connector 13 has a plug body 130 (see FIG. 2) that is mounted with the remaining of the first conductive terminals 14 thereon, as best shown in FIG. 3, wherein each first conductive terminal 14 has a first end attached to the connecting side surface 112 of the main circuit board 11 and disposed outwardly of the plug body 130, a second end attached on a free side of the plug body 130 distal from the connecting side surface 112 of the main circuit board 11, and an intermediate portion interconnecting the first and second ends and extending along the plug body 130.

Figure 6:
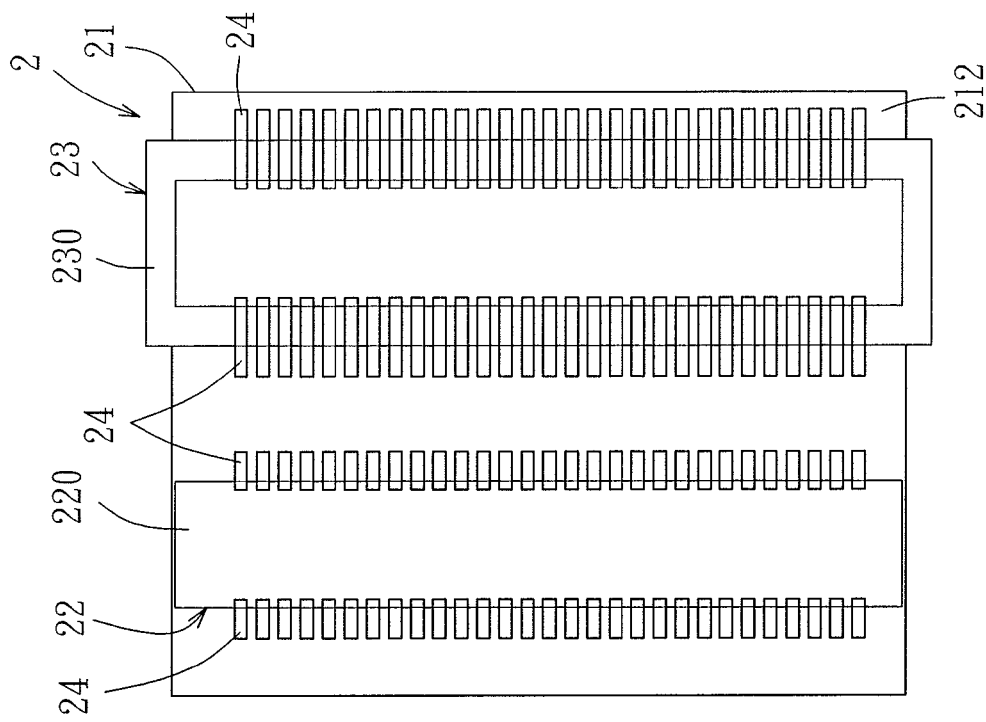
FIG. 6 is a schematic bottom view showing the daughter board unit of the first preferred embodiment.
Figure 5:
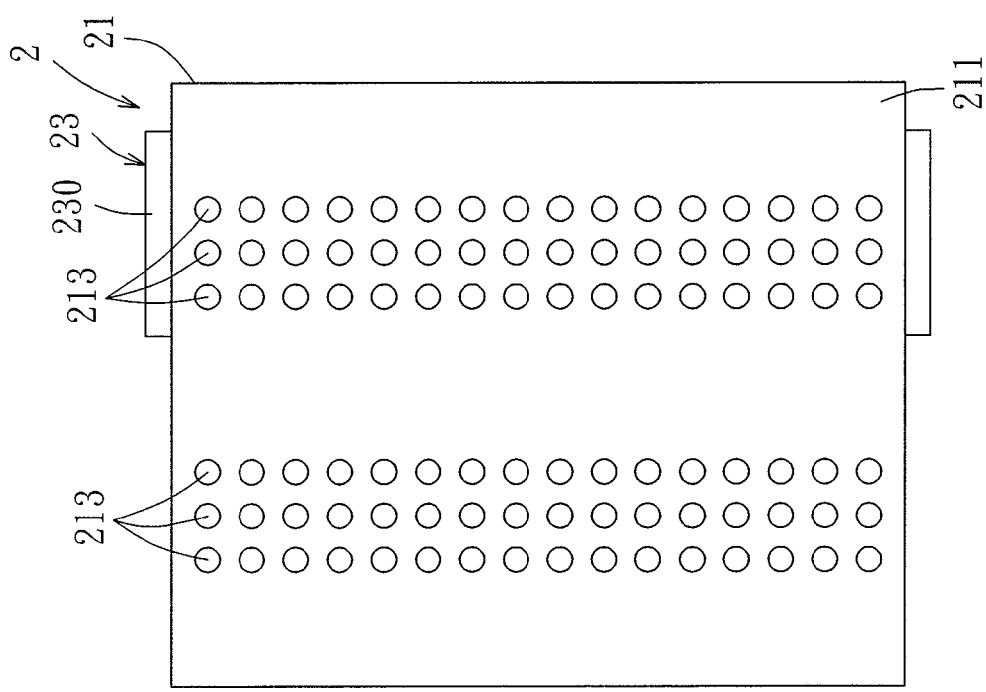
FIG. 5 is a schematic top view showing a daughter board unit of the first preferred embodiment.

Referring further to FIGS. 5 and 6, the daughter board unit 2 includes a daughter circuit board 21 and a daughter connector unit.

The daughter circuit board 21 has opposite mounting and connecting side surfaces 211, 212. The mounting side surface 211 of the daughter circuit board 21 is formed with a plurality of electrical contacts 213 in the form of solder balls. The electrical contacts 213 on the mounting side surface 211 of the daughter circuit board 21 correspond respectively to the electrical contacts 113 on the mounting side surface 111 of the main circuit board 11, as shown in FIGS. 4 and 5.

The daughter connector unit is disposed fixedly on the connecting side surface 212 of the daughter circuit board 21, and is coupled detachably to the main connector unit of the main board unit 1. The daughter connector unit has a plurality of second conductive terminals 24 arranged so that each electrical contact 213 on the mounting side surface 211 of the daughter circuit board 21 is connected electrically to a corresponding second conductive terminal 24 of the second conductive terminals through a printed circuit (not shown) formed on the daughter circuit board 21. Thus, the second conductive terminals 24 of the daughter connector unit contact electrically and respectively the first electrical terminals 14 of the main connector unit when the daughter connector unit is coupled to the main connector unit. In this embodiment, the daughter connector unit includes a third connector 22 corresponding to the first connector 12 of the main board unit 1, and a fourth connector 23 corresponding to the second connector 13. The third connector 22 has a plug body 220 (see FIG. 2) that is mounted with half the second conductive terminals 24 thereon, as best shown in FIG. 6, wherein each second conductive terminal 24 has a first end attached to the connecting side surface 212 of the daughter circuit board 21 and disposed outwardly of the plug body 220, a second end attached to a free side of the plug body 220 distal from the connecting side surface 212 of the daughter circuit board 21, and an intermediate portion interconnecting the first and second ends and extending along the plug body 220. The fourth connector 23 has a socket body 230 (see FIG. 2) that is mounted with the remaining of the second conductive terminals 24 thereon, as best shown in FIG. 6, wherein each second conductive terminal 24 has a first end attached to the connecting side surface 212 of the daughter circuit board 21 and disposed outwardly of the socket body 230, a second end opposite to the first end, disposed in the socket body 230 and attached to the connecting side surface 212 of the daughter circuit board 21, and a U-shaped portion interconnecting the first and second ends and extending along the socket body 230.

When the daughter connector unit is coupled to the main connector unit, the first and second connectors 12, 13 are coupled respectively to the third and fourth connectors 22, 23. In this case, the plug body 220 of the third connector 22 is inserted fittingly into the socket body 120 of the first connector such that the second conductive terminals 24 on the plug body 220 of the third connector 22 contact electrically and respectively the first conductive terminals 14 on the socket body 120 of the first connector 12. The socket body 230 of the fourth connector 23 permits fitting insertion of the plug body 130 of the second connector 13 thereinto such that the second conductive terminals 24 on the socket body 230 of the fourth connector 23 contact electrically and respectively the first conductive terminals 14 on the plug body 130 of the second connector 13.

The integrated circuit device 3 is mounted fixedly on the mounting side surface 211 of the daughter circuit board 21, and has a plurality of electrical contacts 31 that are connected electrically and respectively to the electrical contacts 213 on the mounting side surface 211 of the daughter circuit board 21 through surface-mount soldering, thereby surface-mounting the integrated circuit device 3 on the mounting side surface 211 of the daughter circuit board 21 (see FIG. 1). As a result, the integrated circuit device 3 is connected electrically to the external circuit board 200 via the daughter board unit 2 and the main board unit 1. In this embodiment, the integrated circuit device 3, the main circuit board 11 and the daughter circuit board 21 have the same width and the same length. In addition, the integrated circuit device 3 is a DRAM. Alternatively, the integrated circuit device 3 is a RAM, such as a mobile RAM, VRAM or graphics RAM. In other embodiments, the integrated circuit device 3 can be a controller IC.

In such a configuration, an assembly of the daughter board unit 2 and the integrated circuit device 3 is easily separated from the main board unit 1. Therefore, by mounting each of various integrated circuit devices 3 to a corresponding daughter board unit 2, testing of the various integrated circuit devices 3 on a single external circuit board 200 is made possible without damaging the various integrated circuit devices 3 as compared to the prior art, where one external circuit board 200 is required for soldering of each integrated circuit device 3 thereon for testing purposes. In addition, in such a testing manner, test costs can be reduced as compared to a conventional on-board testing manner for various integrated circuit devices, each of which is mounted on a more costly main board than the daughter circuit board 21. Furthermore, since the main circuit board 11 is designed to have the same length and the same width as the integrated circuit device 3, the integrated circuit assembly 100 of the present invention is suitable to be mounted on an existing external circuit board 200 with a limited mounting area without having to rearrange the electrical contacts 201. Moreover, an assembly of the main board unit 1 and the daughter board unit 2 has a thickness ranging from 2.45 mm to 3.25 mm. As a result, the integrated circuit assembly 100 can be designed to have a reduced thickness of about 4.35 mm, which is significantly thinner than that of the socket of the aforesaid conventional memory module. Therefore, high-speed signal transmission between the external circuit board 200 and the integrated circuit device 3 with a reduced loss can be achieved. In addition, the integrated circuit assembly 100 of the present invention can be applied to handheld computerized apparatuses with a compact size (e.g., a tablet PC, ultrabook, handheld computer, personal digital assist (PDA), etc.), solid-state drives (SSD), smart TVs, digital set-top boxes, graphics controller boards, Handheld devices, or Mobile DRAM applications.

Figure 7:
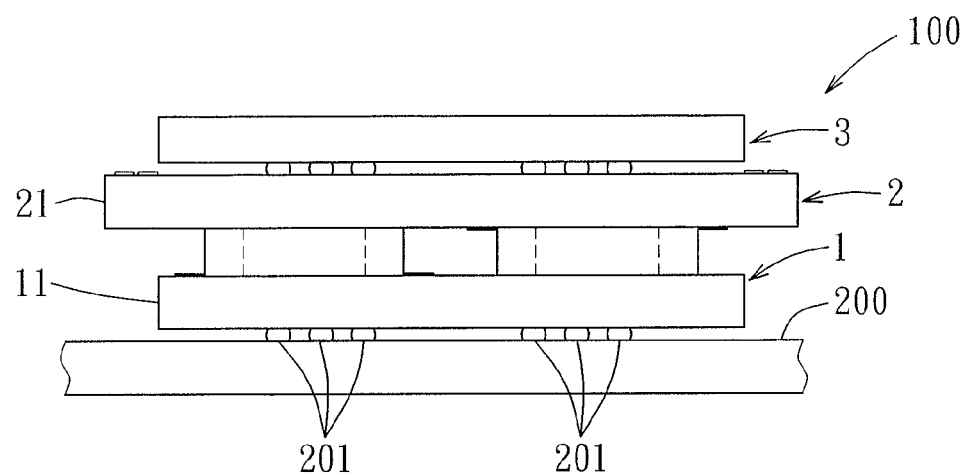
FIG. 7 is a schematic side view showing the second preferred embodiment of an integrated circuit assembly according to the present invention when mounted on an external circuit board.

FIG. 7 illustrates the second preferred embodiment of an integrated circuit assembly 100 according to this invention, which is a modification of the first preferred embodiment. Unlike the first preferred embodiment, the daughter circuit board 21 of the daughter board unit 2 is greater in width than the integrated circuit device 3 and the main circuit board 11 of the main board unit (see FIG. 7).

Figure 8:
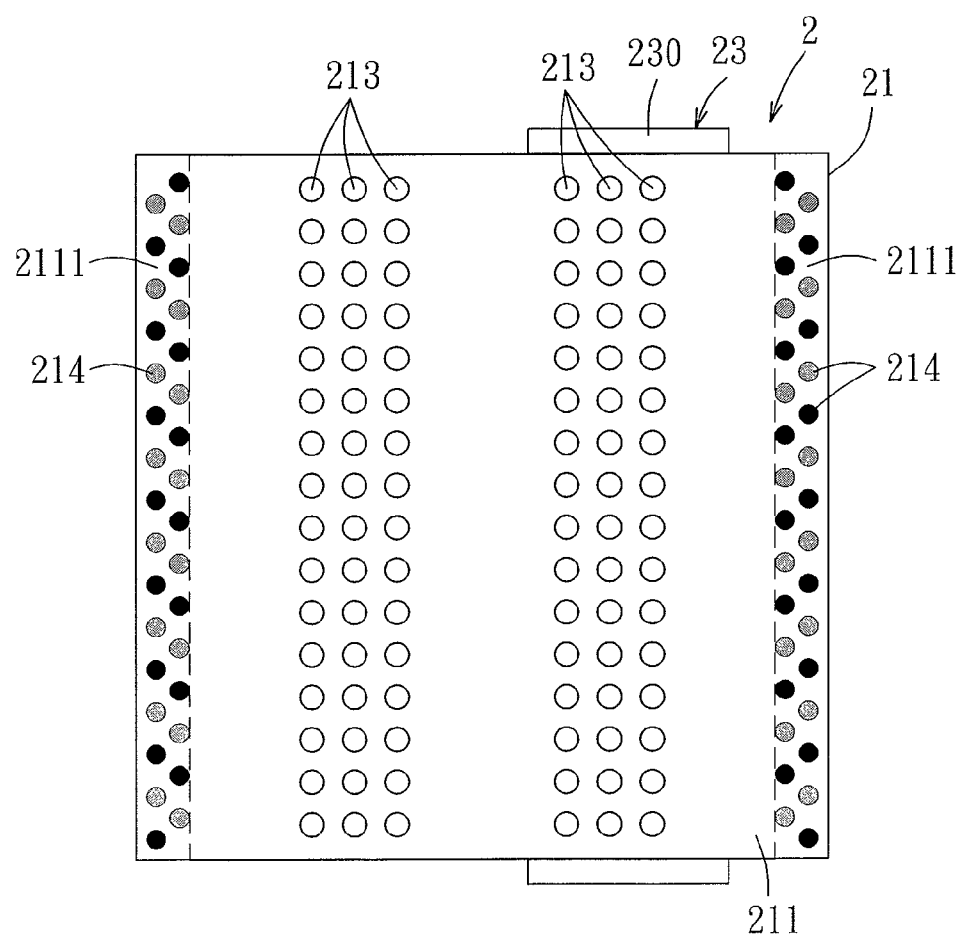
FIG. 8 is a schematic top view showing a daughter board unit of the second preferred embodiment.

Referring to FIG. 8, in this embodiment, the mounting side surface 211 of the daughter circuit board 21 has an exposed portion, which consists of exposed opposite lateral areas 2111. In addition, the daughter circuit board 21 is formed with a plurality of exposed test contacts 214 provided on the exposed portion of the mounting side surface 211, i.e., the opposite lateral areas 2111. Each test contact 214 is connected electrically to a corresponding electrical contact 213 on the mounting side surface 211 of the daughter circuit board 21 through a printed circuit (not shown) formed on the daughter circuit board 21. It is noted that, due to the presence of the exposed test contacts 214, additional on-board tests for the integrated circuit device 3 as required can be easily attained.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. An integrated circuit assembly adapted to be mounted on an external circuit board that is formed with a plurality of electrical contacts, said integrated circuit assembly comprising:
    a main board unit including
        a main circuit board having opposite mounting and connecting side surfaces, said mounting side surface of said main circuit board being formed with a plurality of electrical contacts corresponding respectively to and adapted to be connected respectively and electrically to the electrical contacts of the external circuit board, and
        a main connector unit disposed fixedly on said connecting side surface of said main circuit board and having a plurality of first conductive terminals arranged so that each of said electrical contacts on said mounting side surface of said main circuit board is connected electrically to a corresponding one of said first conductive terminals;
    a daughter board unit including
        a daughter circuit board having opposite mounting and connecting side surfaces, said mounting side surface of said daughter circuit board being formed with a plurality of electrical contacts that correspond respectively to said electrical contacts on said mounting side surface of said main circuit board, and
        a daughter connector unit disposed fixedly on said connecting side surface of said daughter circuit board, and coupled detachably to said main connector unit in a socket-and-plug arrangement, said daughter connector unit having a plurality of second conductive terminals arranged so that each of said electrical contacts on said mounting side surface of said daughter circuit board is connected electrically to a corresponding one of said second conductive terminals and so that said second conductive terminals of said daughter connector unit contact electrically and respectively said first conductive terminals of said main connector unit when said daughter connector unit is coupled to said main connector unit; and
    an integrated circuit device mounted fixedly on said mounting side surface of said daughter circuit board, and having a plurality of electrical contacts connected electrically and respectively to said electrical contacts on said mounting side surface of said daughter circuit board such that said integrated circuit device is connected electrically to the external circuit board via said daughter board unit and said main board unit.

2. The integrated circuit assembly as claimed in claim 1, wherein said integrated circuit device, said main circuit board and said daughter circuit board have the same length and the same width.

3. The integrated circuit assembly as claimed in claim 1, wherein:
    said main connector unit of said main board unit includes a first connector mounted with a group of said first conductive terminals thereon, and a second connector mounted with remaining one(s) of said first conductive terminals thereon;
    said daughter connector unit of said daughter board unit includes a third connector corresponding to said first connector and mounted with a part of said second conductive terminals thereon that corresponds to the group of said first conductive terminals, and a fourth connector corresponding to said second connector and mounted with remaining one(s) of said second conductive terminals thereon that corresponds to the remaining one(s) of said first conductive terminals; and
    when said daughter connector unit is coupled to said main connector unit, said first and second connectors are respectively coupled to said third and fourth connectors.

4. The integrated circuit assembly as claimed in claim 3, wherein said integrated circuit device is one of a DRAM, a RAM, and an NAND flesh memory.

5. The integrated circuit assembly as claimed in claim 3, wherein:
    said first connector has a socket body mounted with the group of said first conductive terminals thereon;
    said second connector has a plug body mounted with the remaining one(s) of said first conductive terminals thereon;
    said third connector has a plug body mounted with the part of said second conductive terminals thereon, and inserted fittingly into said socket body of said first connector when said third connector is coupled to said first connector; and
    said fourth connector has a socket body mounted with the remaining one(s) of said second conductive terminals thereon, and permitting fitting insertion of said plug body of said second connector thereinto when said fourth connector is coupled to said second connector.

6. The integrated circuit assembly as claimed in claim 1, wherein an assembly of said main board unit and said daughter board unit has a thickness ranging from 2.45 mm to 3.25 mm.

7. The integrated circuit assembly as claimed in claim 1, wherein:
   said daughter circuit board of said daughter board unit has a size in length or width larger than that of said main circuit board of said main board unit or said integrated circuit device; and
   said daughter circuit board of said daughter board unit is formed with a plurality of exposed test contacts each connected electrically to a corresponding one of said electrical contacts on said mounting side surface of said daughter circuit board.

8. The integrated circuit assembly as claimed in claim 7, wherein said mounting side surface of said daughter circuit board of said daughter board unit has an exposed portion provided with said test contacts thereon.

\* \* \* \* \*